United States Patent [19]
Oda et al.

[11] Patent Number: 4,495,429
[45] Date of Patent: Jan. 22, 1985

[54] LIMITER AMPLIFIER

[75] Inventors: Takashi Oda; Koichi Nagata, both of Tokyo, Japan

[73] Assignee: Nippon Electric Co. Ltd., Tokyo, Japan

[21] Appl. No.: 386,513

[22] Filed: Jun. 9, 1982

[30] Foreign Application Priority Data

Jun. 12, 1981 [JP] Japan .................. 56-90516

[51] Int. Cl.³ .............. G06G 7/12; H03K 5/153; H03F 3/45
[52] U.S. Cl. .................... 307/491; 307/358; 307/549; 307/555; 330/257
[58] Field of Search ............ 307/494, 350, 351, 358, 307/359, 555, 264, 540, 546, 547, 549, 491, 310; 330/257, 259, 260, 261

[56] References Cited

U.S. PATENT DOCUMENTS

| | | | |
|---|---|---|---|
| 3,144,564 | 8/1964 | Sikorra | 307/494 |
| 3,643,107 | 2/1972 | Gilbreath | 307/494 |
| 3,932,768 | 1/1976 | Takahashi et al. | 307/264 |
| 4,039,981 | 8/1977 | Ohashi et al. | 307/264 |
| 4,167,649 | 9/1979 | Ohsawa et al. | 307/270 |
| 4,172,238 | 10/1979 | Kusakabe | 330/252 |
| 4,197,505 | 4/1980 | Nishijima et al. | 330/261 |
| 4,198,602 | 4/1980 | Nishijima et al. | 304/555 |
| 4,429,416 | 1/1984 | Page | 330/257 |
| 4,442,549 | 4/1984 | Main | 330/252 |

OTHER PUBLICATIONS

*IEEE Journal of Solid-State Circuits,* vol. SC-6, No. 1, 2/71 "New Developments in IC Voltage Regulators", Robert J. Widlar Primary Examiner—John S. Heyman
Assistant Examiner—Timothy P. Callahan
Attorney, Agent, or Firm—Laff, Whitesel, Conte & Saret

[57] ABSTRACT

A limiter amplifier with a power supply has a plurality of cascade-connected differential amplifiers for limiting the amplitude of an input signal. Each of the amplifiers has a first constant current circuit. A biassing circuit, having a second constant current circuit, is connected to the input of the differential amplifier for supplying its biassing needs. A third constant current circuit activates the first and second constant current circuits. A voltage regulator is connected to the power supply for providing a constant voltage to each of the three constant current circuits. The voltage regulator and the first to third constant current circuits have the same temperature characteristics.

8 Claims, 8 Drawing Figures

LIMITER AMPLIFIER

BACKGROUND OF THE INVENTION

The present invention relates to a limiter amplifier suitable for use in a radio communication unit, more particularly in a portable communication unit, and such as a paging receiver.

Compactness and light weight are strongly required on this kind of portable communication unit, which uses a limiter amplifier in addition to a frequency discriminator, to demodulate an FM carrier wave.

One example of conventional limiter-amplifiers includes a plurality of amplifiers of the grounded-emitter type, connected in cascade by means of coupling capacitors. The amplifier has upper and lower limits which are determined by a saturated collector voltage, i.e., a power source voltage. Therefore, the use of a low-voltage power source, such as a single dry battery, may provide a distorted waveform having asymmetric upper and lower limits at the output of the amplifier.

In addition, such a limiter amplifier cannot be fabricated in a monolithic integrated circuit because coupling capacitors are required. Moreover, since conventional limiter amplifiers have no temperature protection, they involve another problem because their saturation characteristics vary with changes in ambient temperature.

SUMMARY OF THE INVENTION

An object of the present invention, therefore, is to provide a limiter amplifier which is capable of operating on a low-voltage power source, such as a single dry battery, and having a favorable saturation characteristic.

Another object of the present invention is to provide a limiter amplifier having a favorable saturation characteristic by keeping the current constant even if there are changes in ambient temperature.

Still another object of the present invention is to provide a limiter amplifier well adaptive to construction in the form of a monolithic integrated circuit.

According to the invention, a limiter amplifier comprises a power supply means. A plurality of cascade-connected differential amplifiers are provided for amplitude-limiting an input signal. Each of the amplifiers has a constant current circuit with a biassing circuit connected to the input of the differential amplifier for supplying it with a biassing voltage. The biassing circuit has a second constant current circuit. A third constant current circuit activates the first and second constant current circuits. A voltage regulator is connected to the power supply means for supplying a constant voltage to the first to third constant current circuits. The temperature related characteristics of the voltage regulator are the same as the temperature related characteristics of the first to third constant current circuits.

BRIEF DESCRIPTION OF THE DRAWINGS

Other objects, features and advantages of the present invention will become more apparent from the detailed description hereunder taken in conjunction with the accompanying drawings, wherein.

DESCRIPTION OF THE PREFERRED EMBODIMENT

Figure 1:
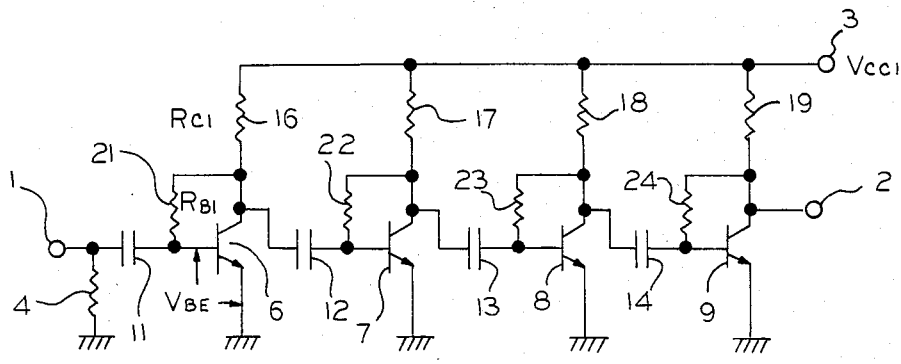
FIG. 1 is a schematic circuit diagram of a conventional limiter amplifier.

Referring to FIG. 1, four grounded-emitter amplifiers respectively have transistors 6 to 9, collector resistors 16 to 19 and feedback bias resistors 21 to 24. These amplifiers are coupled to one another by capacitors 11 to 14, respectively. Reference numerals 1, 2, 3 and 4 respectively represent an input terminal, an output terminal, a power supply terminal and a resistor for determining the input impedance.

Figure 2A:
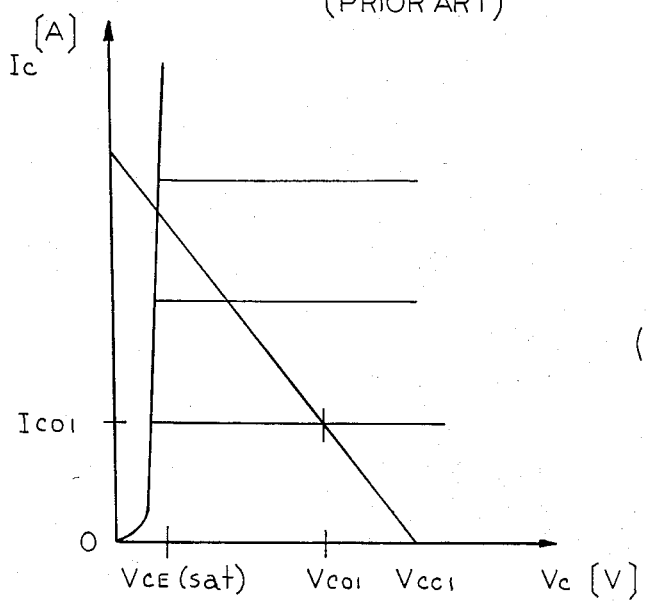
FIGS. 2A and 2B respectively show the current-voltage characteristic of each transistor shown in FIG. 1 and the limited output waveform of the circuit of FIG. 1.

It is assumed that the voltage at the power supply terminal 3 is represented by $V_{CC1}$, the base-emitter voltage of the transistors 6, 7, 8 and 9 by $V_{BE}$, the D.C. amplification factor of the transistors by $h_{FE}$, the resistance of the collector resistors 16, 17, 18 and 19 by $R_{C1}$ and the resistances of the feedback bias resistors 21, 22, 23 and 24 by $R_{B1}$. As will be seen from FIG. 2A, the D.C. operating points $I_{CO1}$ and $V_{CO1}$ of the transistors 6, 7, 8 and 9 can be defined by the following equations, respectively:

$$I_{CO1} = \frac{V_{CC1} - V_{BE}}{R_{C1} + R_{B1}/h_{FE}} \quad (1)$$

$$V_{CO1} = V_{CC1} - I_{CO1} \cdot R_{C1} \quad (2)$$

$$= V_{BE} + \frac{I_{CO1} \cdot R_{B1}}{h_{FE}}$$

When an input signal of large amplitude is applied to terminal 1, the output voltage of the transistor 6, 7, 8 or 9 ranges between its saturated collector voltage $V_{CE(sat)}$ and the power source voltage $V_{CC1}$. The output of the limiter amplifier will have a favorable saturated waveform with a 50 percent duty factor if the following equation is satisfied:

$$\frac{V_{CC1} + V_{CE(sat)}}{2} = V_{CO1} \quad (3)$$

Supposing that $V_{CE(sat)}=0.15$ (V), $V_{BE}=0.65$ (V), $I_{CO1}=40(\mu A)$, $R_{B1}=180(K\Omega)$ and $h_{FE}=100$, $$V_{CO1} = 0.65 + \frac{40 \times 10^{-6} \times 180 \times 10^3}{100} = 0.72 \text{ (V)}.$$

The power source voltage $V_{CC1}$ then required will be
$V_{CC1}=2V_{CO1}-V_{CE(sat)}=1.29$ (V)

Figure 2B:
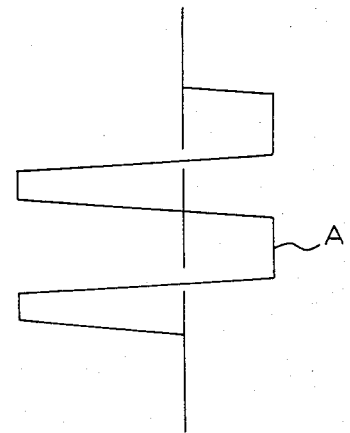

However, the supply of 1.29 (V) from a single dry battery would extremely shorten the useful life of the battery, and a nickel cadmium battery would be unusable in this case. If a dry battery is used, its terminal voltage is usually somewhere between 1.0 and 1.05(V). Accordingly, Equation (3) above is not satisfied, resulting in the disadvantage that the output waveform A of the prior art limiter amplifier shown in FIG. 1 is distorted when saturated, as shown in FIG. 2B.

There is another disadvantage because the presence of the coupling capacitors 11, 12, 13 and 14 between the transistors 6, 7, 8 and 9 makes the conventional limiter amplifier unsuitable for production as a monolithic integrated circuit.

Figure 3:
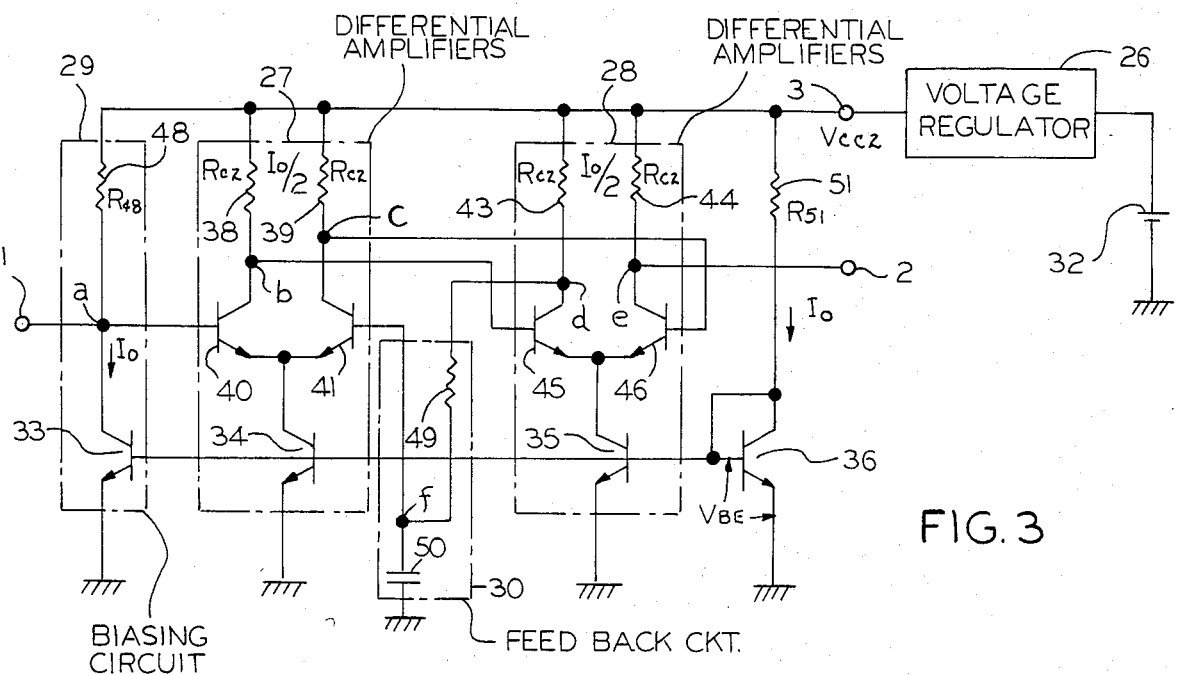
FIG. 3 is a schematic circuit diagram of the limiter amplifier according to the present invention.

Referring now to FIG. 3, a limiter amplifier according to the present invention includes a voltage regulator 26, a circuit in which differential amplifiers 27 and 28 are directly coupled to each other, a biassing circuit 29, and a feedback circuit 30. The voltage regulator 26, deriving its input from a dry battery 32, has a temperature declination such that the currents through transistors 33, 34, 35 and 36 remain constant irrespective of temperature variations. Voltage regulator 26 supplies a regulated voltage to these transistors through a power supply terminal 3. The transistor 36 provides the transistors 33 to 35 with a constant bias voltage. The differential amplifier 27, driven by the transistor 34, has resistors 38 and 39 and transistors 40 and 41. Similarly, the differential amplifier 28, driven by the transistor 35, has resistors 43 and 44 and transistors 45 and 46. The biassing circuit 29 includes the transistor 33 and a resistor 48, and the feedback circuit 30 comprises a capacitor 50 and a resistor 49 for effecting a D.C. feedback from the collector electrode of the transistor 45 to the base electrode of the transistor 41. Together with the transistor 36, the transistors 33 to 35 constitute constant current circuits to supply constant currents to the biasing circuit 29 and the differential amplifiers 27 and 28, respectively.

In such a circuit structure, the collector current $I_O$ of the transistor 36 is obtained by the following approximation:

$$I_O \approx \frac{V_{CC2} - V_{BE}}{R_{51}} \quad (4)$$

where $V_{CC2}$ is the voltage at the power supply terminal 3, $R_{51}$ is the resistance of a resistor 51 and $V_{BE}$ is the base-emitter voltage of the transistor 36. If the transistor 36 has the same characteristic as the transistors 33, 34 and 35, the collector currents of each of these transistors 33, 34 and 35 will be equal to $I_O$. Meanwhile, if the resistances of the resistors 38, 39, 43 and 44 are all $R_{C2}$, the collector currents of the transistors 40, 41, 45 and 46 will be $I_O/2$, and the operating points $I_{CO2}$ and $V_{CO2}$ of the differential amplifiers 27 and 28 are:

$$I_{CO2} = \frac{I_O}{2} \quad (5)$$

$$V_{CO2} = V_{CC2} - \frac{I_O \cdot R_{C2}}{2}$$

Figure 4A:
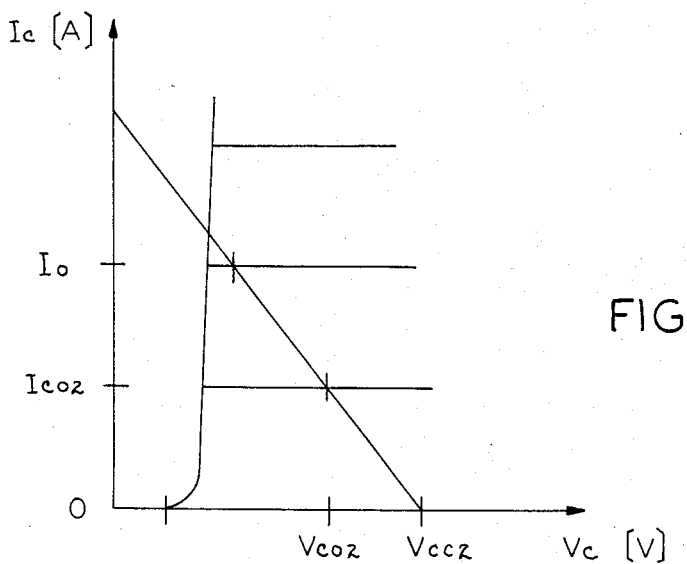
FIGS. 4A and 4B respectively show the current-voltage characteristic of each transistor shown in FIG. 3 and the limited output waveform of the circuit of FIG. 3.
Figure 4B:
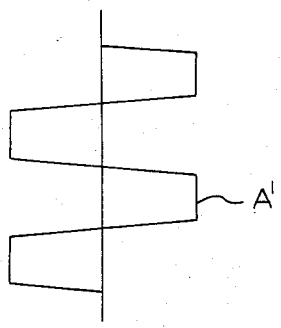

FIG. 4A shows the collector current vs. collector voltage characteristic of the transistor 40 constituting the differential amplifier 27. In FIG. 4A, the maximum collector current is determined by the constant current $I_O$, beyond which no current will flow through the collector electrode. Therefore, the differential amplifier 27 acts as a current mode limiter. When a large signal is supplied to an input terminal 1, the collector output waveform of the transistor 40 will be as shown at A' in FIG. 4B, which is a highly favorable saturated waveform. Thus, a limiter amplifier operates with a low-voltage power source and yet has a favorable saturation characteristic, even with directly coupled differential amplifiers 27 and 28, whose operating points as to satisfy Equations (5). The direct coupling of the differential amplifiers 27 and 28 further provides a limiter amplifier which is suitable for monolithic circuit integration.

The temperature variation rate of Equation (4) is represented by:

$$\frac{\Delta I_O}{\Delta T} = \frac{1}{R_{51}} \left( \frac{\Delta V_{CC2}}{\Delta T} - \frac{\Delta V_{BE}}{\Delta T} \right) \quad (6)$$

If the condition of $$\frac{\Delta V_{CC2}}{\Delta T} = \frac{\Delta V_{BE}}{\Delta T} \quad (7)$$

is satisfied, the following equation is given:

$$\frac{\Delta I_O}{\Delta T} = 0$$

Thus the constant current $I_O$ is insensitive to temperature variations. Then, from Equations (5), the following equations will hold with respect to the operating points of the differential amplifiers 27 and 28:

$$\frac{\Delta I_{CO2}}{\Delta T} = \frac{1}{2} \frac{\Delta I_O}{\Delta T} = 0$$

$$\frac{\Delta V_{CO2}}{\Delta T} = \frac{\Delta V_{CC2}}{\Delta T} - \frac{R_{C2}}{2} \frac{\Delta I_O}{\Delta T} = \frac{\Delta V_{CC2}}{\Delta T}$$

Figure 5:
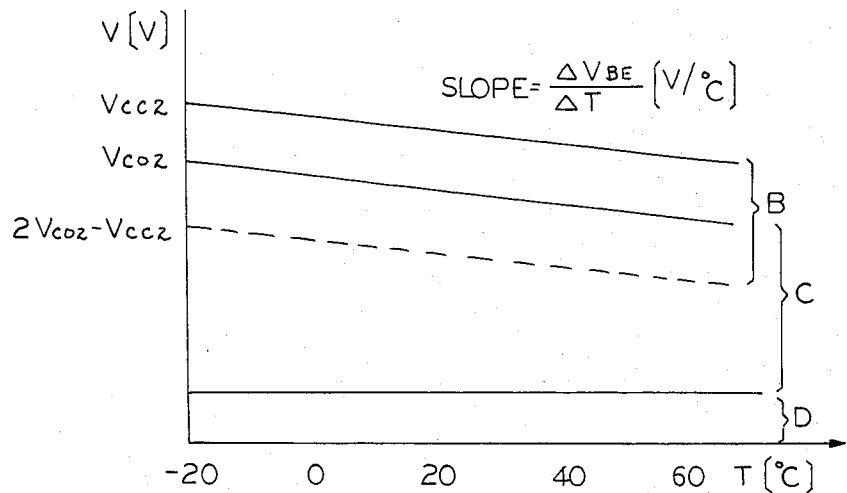
FIG. 5 shows the thermal characteristics of the power source voltage, and the D.C. operating points and output voltages of the transistors in the limiter amplifier shown in FIG. 3.

This collector operating point $V_{CO2}$ will have the same temperature declination as the voltage $V_{CC2}$ at the power supply terminal 3, i.e. that of the base emitter voltage $V_{BE}$ of the transistor 36, The thermal variance is shown in FIG. 5. In FIG. 5, lines B represent the collector output range of the transistor 40, 41, 45 or 46; C represents the base-emitter voltage range of transistor 40; and line D represents, the collector-emitter voltage range of transistor in the constant current circuit.

The transistor 40, under the above stated conditions, supplies large signals ranging from $(2V_{CO2} - V_{CC2})$ to $V_{CC2}$. The value of $$V_{CC2} - (2V_{CO2} - V_{CC2}) = 2(V_{CC2} - V_{CO2})$$

does not vary with temperature. Thus, the saturated waveform will remain highly favorable. Moreover the value of $2(V_{CC2} - V_{CO2})$ will not vary, even if the temperature changes.

Further, the resistance of the resistor 48, in the base biassing circuit 29 for the transistor 40 is represented by $R_{48}$. The base voltage $V_B$ of the transistor 40 is $$V_B = V_{CC2} - I_O \cdot R_{48}$$

because the collector current of the transistor 33 is the constant current $I_O$. The variation with respect to temperature is $$\frac{\Delta V_B}{\Delta T} = \frac{\Delta V_{CC2}}{\Delta T} = \frac{\Delta V_{CO2}}{\Delta T}$$

equal to that of the regulated voltage at the power supply terminal 3. The resistance $R_{48}$ of the resistor 48 can be as selected as to make a node voltage a equal to node voltages b and c. In this particular embodiment of the invention, the resistance $R_{48}$ is $$R_{48} = \frac{R_{C2}}{2}$$

and node voltages a, b, c, d, e and f are all equal to each other. Thus, the waveform delivered to the output terminal 2 of the limiter amplifier will have as favorable a saturated form as the collector output waveform of the transistor 40.

Therefore, the output waveform at the output terminal 2 will be from $(2V_{CO2}-V_{CC2})$ to $V_{CC2}$. The saturated waveform will remain highly favorable even if the temperature varies, with the value of $2(V_{CC2}-V_{CO2})$ unchanged. Thus, the voltage regulator 26, which supplies a regulated voltage having a temperature declination satisfying the condition of $$\frac{\Delta V_{CC2}}{\Delta T} = \frac{\Delta V_{BE}}{\Delta T}$$

makes all of the node voltages a, b, c, d, e and f equal. The differential amplifiers 27 and 28 are directly coupled to each other and to the biassing circuit 29. The limiter amplifier has a highly favorable saturation characteristic, against the voltage fluctuation of the dry battery 32 and against temperature variations.

The bias voltage is stabilized by feeding a D.C. voltage back to the base electrode of the transistor 41, from the collector electrode of the transistor 45, and through a low-pass filter comprising the resistor 49 and the capacitor 50. The differential amplifier 27, comprising the transistors 40, 41 and 34, detects any error in the voltage, and operates to equalize the base voltage f of the transistor 41 with the base voltage a of the transistor 40. The node voltages a and f are thereby made equal. Since the resistors 38, 39, 43 and 44 have the same resistances, the node voltages a to f are equal to one another. The node voltages a to f have to be greater than the sum of the base-emitter voltage $V_{BE}$ and the collector-emitter voltage $V_{CE}$ of the transistor 34. Now supposing that the base-emitter voltage $V_{BE}$ of the transistor 40 is 0.65 (V) and the collector-emitter voltage $V_{CE}$ of the transistor 34 is 0.2 (V), the limiter amplifier will be fully operable at node voltages a to f of 0.85 (V) and a regulated output voltage of 1.05 (V).

Figure 6:
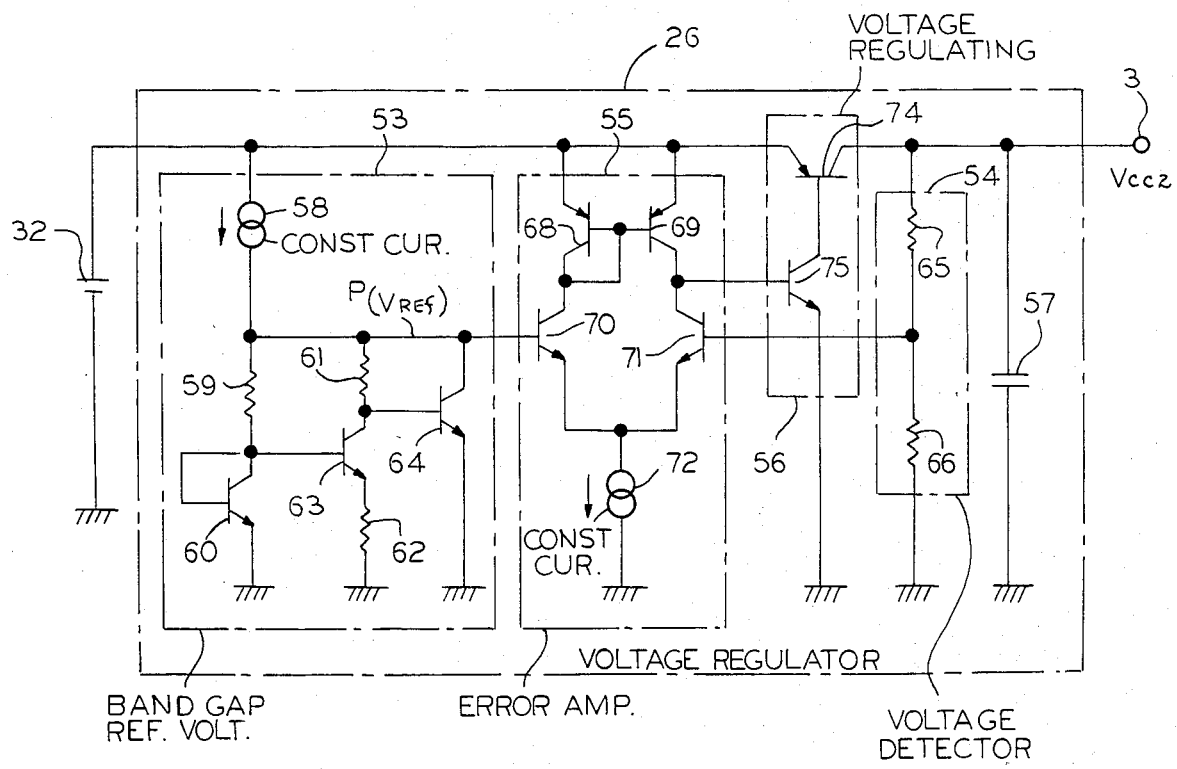
FIG. 6 is a schematic circuit diagram of the voltage regulator for use in the limiter amplifier shown in FIG. 3.

FIG. 6 illustrates in detail the structure of the voltage regulator 26, referred to in FIG. 3. In FIG. 6, the voltage regulator 26 comprises a band-gap reference voltage generating section 53, a voltage detecting section 54, an error amplifying section 55, a voltage regulating section 56 and a power source decoupling capacitor 57. The band-gap reference voltage generating section 53 has a constant current circuit 58, a resistor 59, a transistor 60, resistors 61 and 62, and transistors 63 and 64. The operation of this circuit is described in detail in a paper entitled "New Developments in IC Voltage Regulators", Robert J. Widlar, IEEE Journal of Solid-State Circuits, Vol. SC-6, pp. 2–7, Feb. 1971. The voltage detection section 54 has resistors 65 and 66; the error amplifying section 55 has transistors 68, 69, 70 and 71. The constant current circuit 72; and the voltage regulating section 56 has transistors 74 and 75.

As described in the Widlar paper, the reference voltage $V_{ref}$ at point P in FIG. 6, is:

$$V_{ref} = V_{g0}\left(1 - \frac{T}{T_0}\right) + V_{BEO}\left(\frac{T}{T_0}\right) + \frac{kT}{q}\log_e\frac{J_1}{J_2} \quad (8)$$

and its differentation with respect to temperature is given by:

$$\frac{\partial V_{ref}}{\partial T} = \frac{V_{g0}}{T} + \frac{V_{BEO}}{T} + \frac{k}{q}\log_e\frac{J_1}{J_2} \quad (9)$$

Where: $V_{g0}$ is the extrapolated energy band-gap voltage for the semiconductor material at absolute zero; q is the charge of an electron; k of Boltzman's constant; T is absolute temperature; $V_{BEO}$ is the base-emitter voltage at $T_0$ and $I_{CO}$; and J is the current density. The resistances of the resistors 65 and 66 is represented by $R_{65}$ and $R_{66}$, respectively. The output voltage $V_{CC2}$ at the power supply terminal 3 of the voltage regulator 26 is given by:

$$V_{CC2} = \frac{R_{65} + R_{66}}{R_{66}} \cdot V_{ref} \quad (10)$$

and the temperature characteristic of the output voltage $V_{CC2}$ is:

$$\frac{\partial V_{cc2}}{\partial T} = \frac{R_{65} + R_{66}}{R_{66}} \cdot \frac{\partial V_{ref}}{\partial T} \quad (11)$$

Here, the simultaneous Equations (8) to (11) are solved to set the output voltage $V_{CC2}$ at a prescribed value and to satisfy the condition of $$\frac{\partial V_{CC2}}{\partial T} \approx \frac{\Delta V_{BE}}{\Delta T}$$

In this embodiment, $V_{CC2}$ is set at 1.05(V) and $\iota V_{CC}/T$ at 1.8(mV/°C.). The resistance $R_{59}$, $R_{61}$, $R_{62}$, $R_{65}$ and $R_{66}$ of the resistors 59, 61, 62, 65 and 66, respectively, are $R_{59}=4(K\Omega)$, $R_{61}=14(K\Omega)$, $R_{62}=2.5(K\Omega)$, $R_{65}=28.4(K\Omega)$, and $R_{66}=76.6(K\Omega)$.

As described above, according to the present invention, all of the circuit constituents including the voltage regulator, the differential two-stage cascade-connected amplifiers and the biasing circuit are directly coupled and, therefore, are suitable for monolithic integration into a single semi-conductor chip. Also, it is possible for the present invention to produce a device with well-matched characteristics by monolithically integrating the constituent transistors and resistors and by arranging them on a single chip. The resulting device, which is so produced, has the advantage of manifesting a favorable saturation characteristic against voltage fluctuations and temperature variations.

The limiter amplifier according to the invention has another advantage of being less susceptible to fluctuation in current consumption, owing to production errors, or the like, and of being subject to no variation in current consumption with a change in temperature, resulting in a reduction of battery consumption.

Furthermore, the voltage regulator can also supply power of stable voltage to other devices within the unit, such as a pager receiver.

What is claimed is:

1. A limiter amplifier comprising:

power supply means;

a plurality of differential amplifier means connected in cascade between an input terminal and an output terminal for amplitude-limiting an input signal applied to said input terminal to provide an amplitude-limited output signal at said output terminal, each of said amplifier means having first transistor means;

biasing circuit means connected to supply a bias voltage to the input terminal of said differential amplifier means, said biasing circuit means having second transistor means;

constant voltage means for supplying a constant bias voltage to said first and second transistor means to enable them to supply constant currents to said amplifier means and said biasing means, respectively;

voltage regulator means connected to said power supply means for supplying a constant voltage to said amplifier means, biasing circuit means and constant voltage means; and said voltage regulator means, said first and second transistor means and said constant voltage means having substantially the same temperature characteristics.

2. A limiter amplifier as claimed in claim 1 further comprising feedback circuit means for feeding back the output of said differential amplifier means to its input to stabilize said biassing voltage.

3. A limiter amplifier as claimed in claim 2, wherein said feedback circuit means includes a low pass filter.

4. A limiter amplifier as claimed in claim 1, wherein said voltage regulator means comprises:

means connected to said power supply means for generating a reference voltage;

means connected to said power supply means for regulating the output of said power supply means to provide a regulated output;

means for detecting the voltage of said regulated output to provide a detected voltage; and means for comparing said reference voltage and said detected voltage to control said regulated output.

5. A limiter amplifier comprising a cascaded plurality of differential amplifiers, means for biasing said cascaded amplifiers, constant current means individually associated with each of said amplifier means and with said biasing means for causing a constant current to flow therethrough, constant current control means for activating the constant current means associated with said amplifiers and said biasing means, and voltage regulator means for supplying power to said amplifiers, said constant current means and said constant current control means at a regulated voltage, said voltage regulator means, said constant current means and said constant current control means having the same temperature characteristics.

6. The limiter amplifier of claim 5 having a feedback means for feeding back the output of the last stage of said amplifiers in inverted polarity to the input of the first stage of said amplifiers.

7. The limiter amplifier of claim 6 wherein said feedback means has a low pass filter characteristic.

8. The limiter amplifier of any one of the claims 1–7 wherein each differential amplifier is directly connected to the next succeeding differential amplifier without requiring coupling capacitors.

* * * * *